(12) United States Patent
Oita

(10) Patent No.: US 7,259,636 B2
(45) Date of Patent: Aug. 21, 2007

(54) SYNCHRONOUS SIGNAL GENERATOR USING A CRYSTAL OSCILLATOR AND FILTER

(75) Inventor: Takeo Oita, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/041,011

(22) Filed: Jan. 7, 2002

(65) Prior Publication Data

US 2002/0093387 A1      Jul. 18, 2002

(30) Foreign Application Priority Data

Jan. 16, 2001 (JP) ............... 2001-007977

(51) Int. Cl.
*H03B 1/00*   (2006.01)

(52) U.S. Cl. .......................... 331/74; 331/76

(58) Field of Classification Search .......... 331/74, 331/76, 116 R, 155, 158; 73/579; 333/187; 128/903
See application file for complete search history.

(56) References Cited

U.S. PATENT DOCUMENTS

| | | | |
|---|---|---|---|
| 2,980,872 A * | 4/1961 | Storch ................. | 333/190 |
| 4,859,969 A | 8/1989 | Malinowski et al. ...... | 331/43 |
| 5,034,703 A | 7/1991 | Schumacher ............ | 331/2 |
| 5,202,647 A | 4/1993 | Muraki et al. .......... | 331/74 |
| 5,270,670 A | 12/1993 | Bladh ................. | 331/74 |
| 5,712,596 A | 1/1998 | Van Amesfoort ......... | 331/76 |
| 6,035,184 A | 3/2000 | Koh ................... | 455/255 |
| 2001/0035794 A1 | 11/2001 | Fujidai et al. ......... | 331/75 |

FOREIGN PATENT DOCUMENTS

| | | |
|---|---|---|
| EP | 0 954 093 | 11/1999 |
| JP | 06-120734 | 4/1994 |
| JP | 06-268442 | 9/1994 |
| JP | 2002-217686 | 8/2002 |

OTHER PUBLICATIONS

Takeshi Yoshida, "Designing Know-how of High Frequency Circuit," Aug. 10, 1989.
Notice of Rejection Grounds for Japanese Patent Application No. 2001-007977, mailed Sep. 7, 2005.

* cited by examiner

*Primary Examiner*—Michael B Shingleton
(74) *Attorney, Agent, or Firm*—Greer, Burns & Crain, Ltd

(57) ABSTRACT

A synchronous signal generator according to the present invention outputs a pulse with low jitter by setting the sine wave output of a crystal oscillator close to an ideal sine wave, and converting it into a pulse signal. By passing the sine wave output from the crystal oscillator of an oscillation frequency f through a filter unit having an equal center frequency f0, inputting output of a filter unit into a pulse converter, and converting the result into a pulse of a rectangular waveform, thereby obtaining an output signal. By configuring the filter unit by the crystal filter and setting it equal to the crystal oscillator in frequency-temperature characteristic, an output signal can be obtained with low jitter although the temperature changes.

14 Claims, 3 Drawing Sheets

SYNCHRONOUS SIGNAL GENERATOR USING A CRYSTAL OSCILLATOR AND FILTER

BACKGROUND OF THE INVENTION

1. Field of the Invention

The present invention relates to a synchronous signal generator using a crystal oscillator, and more specifically to a synchronous signal generator for suppressing the jitter (fluctuation of a signal with time) of a synchronous signal.

2. Description of the Related Art

A synchronous signal generator is known as a pulse generator for controlling a signal with time for a computer, etc. For example, a synchronous signal generator converts the sine wave outputted from a crystal oscillator into a pulse and outputs it. Recently, to ensure the synchronization of a signal, a high precision synchronous signal is demanded, and the synchronous signal generator is requested to reduce the jitter of an output signal.

FIG. 1 is an explanatory block diagram of a common synchronous signal generator.

The synchronous signal generator shown in FIG. 1 includes a crystal oscillator 1 and a pulse converter 2. The crystal oscillator 1 includes a crystal vibrator 3 and an oscillator circuit unit 4, and forms, for example, a Corpitts type oscillator circuit. The crystal vibrator 3 is configured by, for example, enclosing an AT-cut crystal piece, an exciting electrode formed on the crystal piece, etc., in an airtight container not shown in the attached drawings. An AT-cut crystal piece (crystal vibrator 3) indicates a vibration frequency (resonance frequency) in inverse proportion to its thickness.

Then, the output signal from the crystal oscillator 1 contains a higher harmonic component fs (f2~fn) having a multiple of the frequency of the fundamental wave component f1 as shown in FIG. 2. In this example, the oscillation frequency f of the crystal oscillator 1 is a frequency of a fundamental wave component f1 of the crystal vibrator 3, and the output waveform is substantially a sine wave output (the output is referred to as sine wave output). However, there is a shift in the frequency value of the crystal vibrator 3 and the crystal oscillator 1, between the fundamental wave component f1 and the higher harmonic component fs.

The pulse converter 2 is formed by, for example, a complementary output driver IC, and converts the sine wave output from the crystal oscillator 1 into positive/negative rectangular pulses. Normally, the sine wave output of the crystal oscillator 1 is amplified by an amplifier 5, and then input into the pulse converter 2.

However, in the synchronous signal generator with the above mentioned configuration, there is the problem of the jitter generated in the output (pulse waveform) by the pulse converter 2.

That is, as shown in FIG. 2, although the sine wave output of the crystal oscillator 1 mainly contains the fundamental wave component f1, it also contains the higher harmonic component fs for even or odd values. Therefore, the sine wave output is not an ideal sine wave that includes only the fundamental wave component f1, generates the distortion by the higher harmonic component fs, and causes the jitter as a result. That is, the smaller the higher harmonic component fs is to the fundamental wave component f1, the closer to the ideal sine wave is the sine wave output of the crystal oscillator 1.

The pulse converter 2 generates a rectangular pulse with the jitter depending on the level of the higher harmonic component fs of the output sine wave of the crystal oscillator 1. In short, the closer to the ideal sine wave the input sine wave is, that is, the smaller the level of the higher harmonic component fs is to the fundamental wave component f1, the smaller jitter of the pulse is generated by the pulse converter 2. However, although the oscillation output of the crystal oscillator 1 mainly contains the fundamental wave component f1, it contains not a small amount of higher harmonic component fs. Therefore, there necessarily occurs the problem of the jitter in the output of the pulse converter 2.

SUMMARY OF THE INVENTION

The present invention aims at providing a synchronous signal generator for outputting a pulse with the jitter reduced by setting the sine wave output of the crystal oscillator the closest possible to the ideal sine wave.

The synchronous signal generator according to the present invention includes a crystal oscillator unit, a filter unit, and a pulse converter unit.

The crystal oscillator unit oscillates an output signal.

The filter unit converts an output signal from the crystal oscillator unit into a signal set closer to the ideal sine wave, and outputs the resultant signal. The signal is converted such that, for example, the level of the specific frequency component of the output signal from the crystal oscillator unit can be relatively higher than the levels of the other frequency components.

With the above mentioned configuration, the synchronous signal generator contains a relatively small amount of higher harmonic component in the output of the crystal oscillator unit, thereby outputting a waveform having small distortion, and obtaining a pulse with small jitter.

Additionally, by configuring the above mentioned filter unit by a crystal filter equal to the crystal oscillator unit in cutting angle of a crystal piece, the jitter of an output signal can be reduced.

DESCRIPTION OF THE PREFERRED EMBODIMENT

Described below is the basic principle of the present invention.

Figure 3:
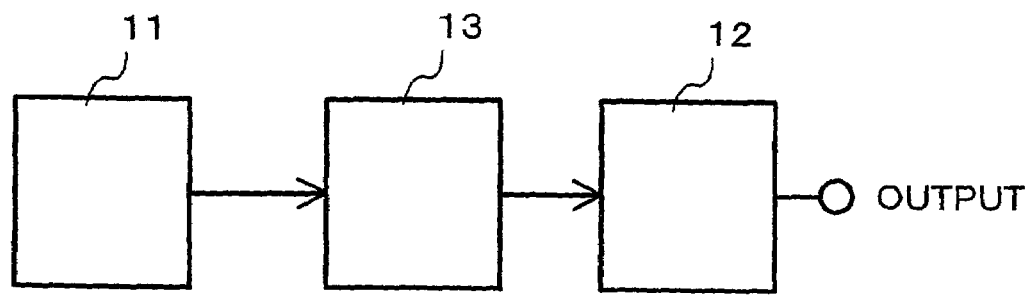
FIG. 3 is a block diagram for explanation of the principle of the present invention.

FIG. 3 is a block diagram showing the synchronous signal generator according to the present invention.

According to the present invention, it is noticed that when the level of the fundamental wave component f1 in the sine wave output by the crystal oscillator is set relatively higher than the level of the higher harmonic component fs, the sine wave output becomes closer to the ideal sine wave, and the pulse which is output by the pulse converter indicates reduced jitter.

The synchronous signal generator shown in FIG. 3 comprises a filter unit 13 between a crystal oscillator 11 for outputting a sine wave signal of a specific frequency using crystal and a pulse converter 12 for converting the sine wave signal into a rectangular pulse. It inputs the output of the crystal oscillator 11 into the filter unit 13, removes or attenuates the frequency component other than the fundamental wave component f1, or amplifies only the level of the fundamental wave component f1, and then inputs the result into the pulse converter 12.

If the filter unit 13 is configured as a band pass filter having the oscillation frequency f as the center frequency f0, and the sine wave output from the crystal oscillator 11 is passed through the band pass filter, then a sine wave output is obtained with the higher harmonic component fs suppressed relative to the fundamental wave component f1. The output pulse obtained by converting the sine wave output into a rectangular wave by the pulse converter 12 has a suppressed influence of the higher harmonic component fs, thereby minimizing the jitter.

The filter unit 13 of the synchronous signal generator according to the present invention is not limited to a unit for passing a signal of a specific frequency, that is, a filter, but can be anything that sets the level of the specific frequency component of an input signal relatively higher than the levels of other frequency components, and outputs the result. For example, it can be an amplifier for amplifying the level of the fundamental wave component f1 into a level higher than the levels of the other frequency components and outputting the resultant signal.

Described below is an embodiment of the synchronous signal generator according to the present invention.

Figure 4:
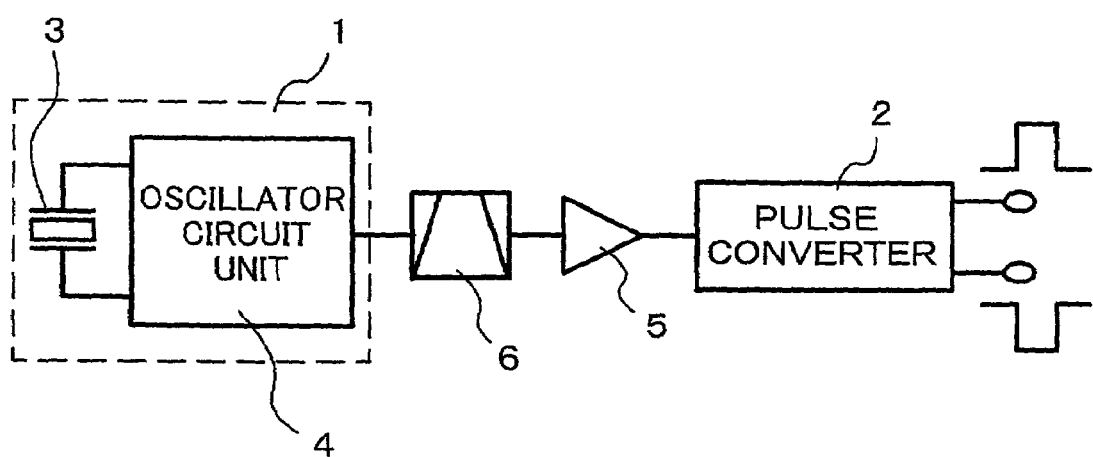
FIG. 4 is a block diagram of the synchronous signal generator according to an embodiment of the present invention.

FIG. 4 is a block diagram of the synchronous signal generator according to an embodiment of the present invention.

Figure 1:
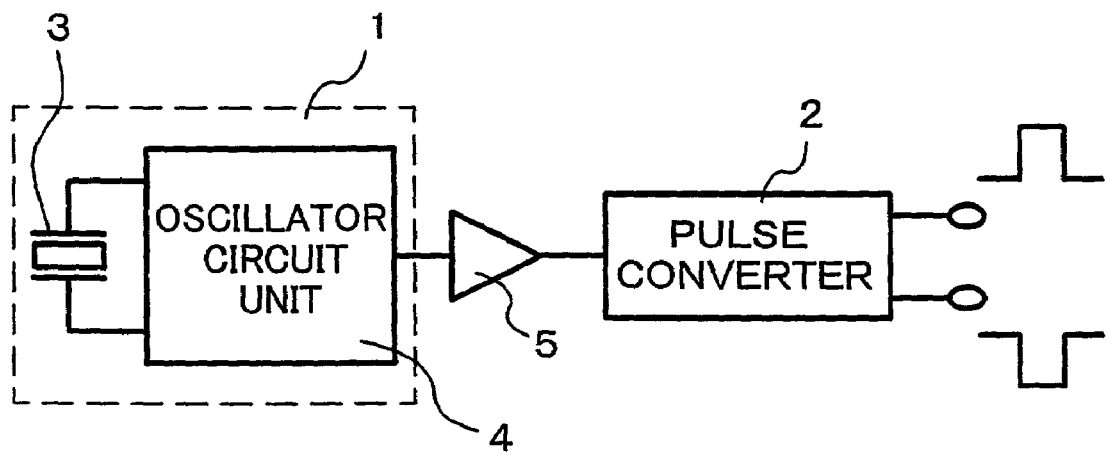
FIG. 1 is a block diagram of a common synchronous signal generator.
Figure 2:
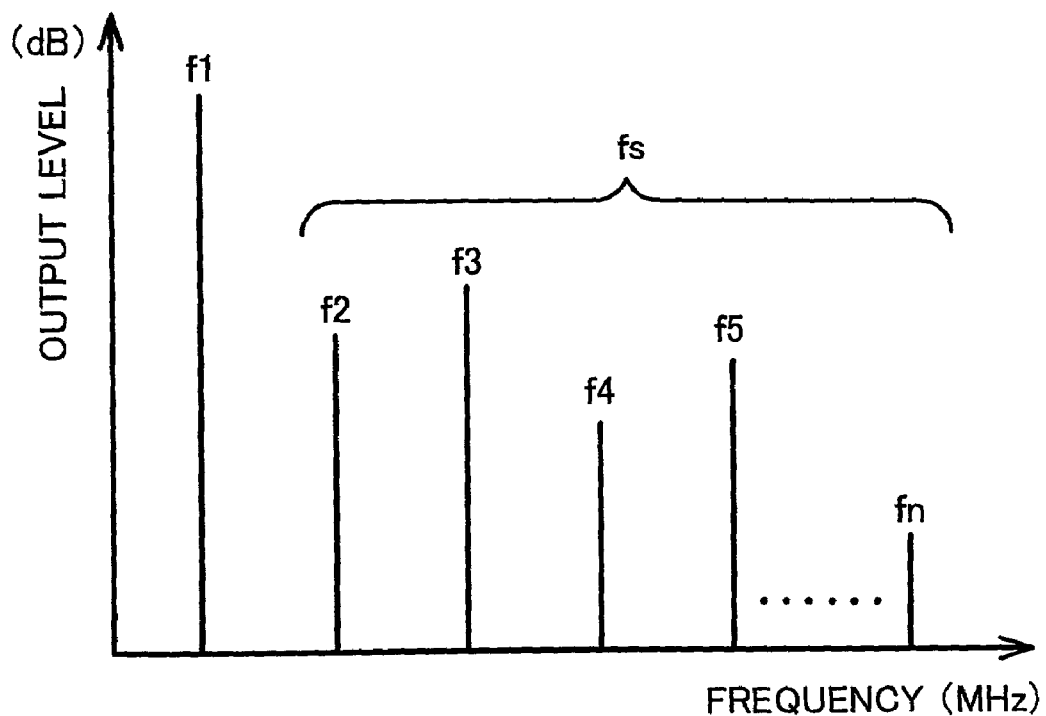
FIG. 2 shows the frequency spectrum for explanation of the problem with the common synchronous signal generator.

In FIG. 4, the component also shown in FIG. 1 is assigned the same reference numeral, and the detailed explanation is omitted in the following descriptions.

The synchronous signal generator shown in FIG. 1 comprises, as in the configuration shown in FIG. 1, the crystal oscillator 1 having the oscillation frequency f of the synchronous signal generator as the fundamental wave component f1, and the pulse converter 2 as the complementary output driver IC for converting sine wave output into positive/negative pulses through the amplifier 5. With the configuration, the crystal oscillator 1 comprises the crystal vibrator 3 and the oscillator circuit unit 4, and the synchronous signal generator in FIG. 4 comprises a crystal filter 6 corresponding to the filter unit 13 shown in FIG. 3 between the crystal oscillator 1 and the pulse converter 2.

The crystal filter 6 forms an input/output electrode for a crystal piece as enclosed in an airtight container, and outputs only the frequency (regulated band pass frequency) in a regulated area upon receipt of input.

The crystal filter 6 has the center frequency f0 of the regulated band pass frequency equal to the oscillation frequency f. That is, the center frequency f0 is equal to the frequency of the fundamental wave component f1 in the sine wave output by the crystal oscillator 1.

Furthermore, by setting the crystal filter 6 and the crystal vibrator 3 equal to each other in frequency-temperature characteristic of a crystal piece, the crystal oscillator 1 and the crystal filter 6 have equal frequency-temperature characteristics. For example, by setting the crystal piece of the crystal filter 6 equal to the AC-cut crystal piece in cutting angle, the crystal oscillator 1 can be equal to the crystal filter 6 in frequency-temperature characteristic, thereby allowing the center frequency f0 to correspond to a change of the frequency of the fundamental wave component f1. Otherwise, also using a device equal to the crystal oscillator 1 in temperature characteristic as an external element for determining the center frequency f0, for example, a capacitor, etc., the crystal oscillator 1 can be equal to the crystal filter 6 in frequency-temperature characteristic. Furthermore, a high Q filter can be used for a temperature change.

The sine wave output of the crystal oscillator 1 is input into the crystal filter 6 having the center frequency f0 as a fundamental wave component f1.

The crystal filter 6 passes a wave through the frequency area centering on the oscillation frequency f (fundamental wave component f1). After the passage, the sine wave output is amplified by the amplifier 5 as described above, input into the pulse converter 2, converted into positive/negative pulses, and output.

Figure 5:
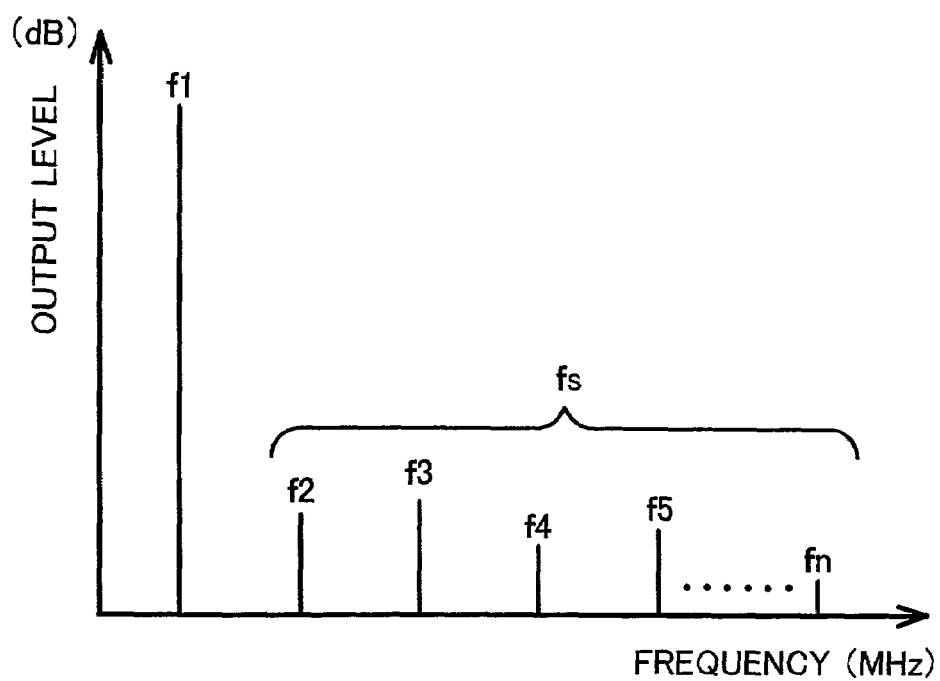
FIG. 5 is the frequency spectrum according to an embodiment of the present invention.

With the configuration as shown in FIG. 4, the sine wave output first passes through the crystal filter 6, then its higher harmonic component fs is removed, and the fundamental wave component f1 becomes dominant. That is, as shown in FIG. 5, the sine wave output from the crystal filter 6 has the frequency spectrum with the higher harmonic component fs furthermore suppressed as compared with the fundamental wave component f1 than in the case in which the higher harmonic component fs does not pass the crystal filter 6. Therefore, after the passage through the crystal filter 6, the sine wave output becomes closer to the ideal sine wave having less distortion by the higher harmonic component fs. Therefore, since the pulse converter 2 receives the ideal sine wave mainly containing the fundamental wave component f1, a pulse is output with low jitter.

Therefore, since the synchronous signal generator as shown in FIG. 4 inputs the sine wave output of the crystal oscillator 1 into the pulse converter 2 after passing it through the crystal filter 6 having the center frequency f0 equal to the oscillation frequency f, the output sine wave of the crystal oscillator 1 can be converted into a pulse signal after having the output sine wave be close to the ideal sine wave, thereby outputting a pulse having low jitter.

Furthermore, according to the present embodiment, the crystal vibrator 3 and the crystal filter 6 are equal in cutting angle of a crystal piece. Thus, the crystal oscillator 1 using the crystal vibrator 3 and the crystal filter 6 are basically equal in frequency-temperature characteristic.

Figure 6:
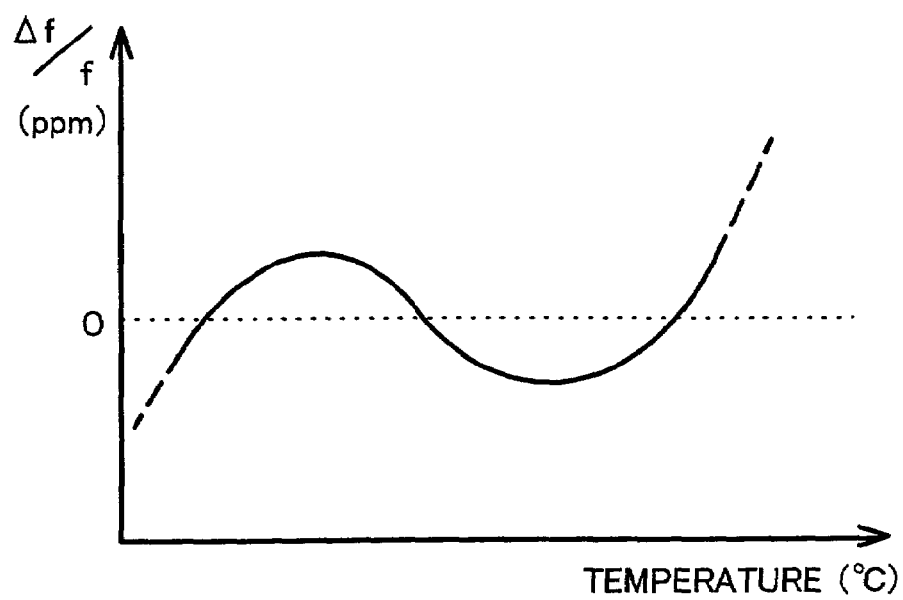
FIG. 6 shows the characteristic of the frequency-temperature of the crystal vibrator applied to an embodiment of the present invention.

FIG. 6 shows the frequency-temperature characteristic of the crystal vibrator.

In FIG. 6, the frequency-temperature characteristic indicates a cubic curve having an inflection point around the ambient temperature (27° C.), the maximum value on the low temperature side and the minimum value on the high temperature side.

The crystal oscillator 1 has the oscillation frequency f depending on the temperature, and the crystal filter 6 also has the center frequency f0 depending on the temperature. These temperature characteristics depend on the cutting angle of crystal. The crystal oscillator 1 and the crystal filter 6 include other components such as a capacitor, etc. as well as a crystal piece. Since the frequency-temperature characteristics of these components are taken into account, they are not equal in frequency-temperature characteristic although they are equal in cutting angle. However, since their frequency-temperature characteristics largely depend on the cutting angle of a crystal piece in most cases, the crystal oscillator 1 and the crystal filter 6 can be nearly equal in frequency-temperature characteristic by setting an equal cutting angle of a crystal piece for the crystal oscillator 1 and the crystal filter 6.

Thus, the center frequencies f0 of the crystal oscillator 1 and the oscillation frequency of the crystal filter 6 similarly change with the change in temperature. That is, when the oscillation frequency f (fundamental wave component f1) changes with temperature, the center frequency f0 of the crystal filter 6 changes correspondingly. Therefore, although the temperature changes, the constant difference in level between the fundamental wave component f1 and the higher harmonic component fs can be maintained. As a result, the synchronous signal generator according to the present embodiment can obtain an ideal sine wave although the temperature changes, thereby outputting a pulse with low jitter.

According to the present embodiment, the pulse converter 2 is a complementary driver IC of two-output type for converting an input signal into a positive/negative pulse. However, it can be a single-output IC, etc. for conversion into a single pulse.

Although the oscillation frequency f of the crystal oscillator 1 is defined as the fundamental wave component f1 as described above, the oscillation frequency f can be another frequency, for example, a frequency three times as high as the fundamental wave component f1 (frequency of the higher harmonic component fs (f3)). However, in this case, if the oscillation frequency f is the frequency of the frequency component f3, the center frequency f0 of the crystal filter 6 also has to be the frequency of the frequency component f3.

Although the crystal filter 6 which is set equal in frequency-temperature characteristic to the filter unit 13 is used for the filter unit 13, the filter unit 13 can have other configurations. For example, the filter unit 13 can be a SAW filter using a surface acoustic wave device.

When the filter unit 13 is configured as a band pass filter, it is designed to be equal in center frequency f0 to the oscillation frequency f as a nominal frequency (normally at the ambient temperature of 25° C.) to suppress the higher harmonic component fs relative to the oscillation frequency f. Since the jitter is mainly caused by the higher harmonic elements higher than the fundamental frequency, the filter unit 13 can be configured as a low pass filter except the frequency higher than the fundamental frequency f1.

Furthermore, by setting the crystal oscillator 1 and the crystal filter 6 equal to each other in cutting angle of crystal piece, substantially the same frequency-temperature characteristic can be obtained in the example above. However, the same frequency-temperature characteristic can also be obtained by providing, for example, a temperature compensation circuit for matching the frequency-temperature characteristics of them and obtaining the same frequency-temperature characteristics.

That is, according to the present invention, the sine wave output of the crystal oscillator 1 is designed to obtain a pulse with low jitter by setting the sine wave output of the crystal oscillator 1 closer to the ideal sine wave in the method using a filter, etc., and the synchronous signal generator with an appropriate and flexible change allowed based on the above mentioned concept is in the technical scope of the present invention.

What is claimed is:

1. A synchronous signal generator converting an output which is a sine wave from a crystal oscillator of an oscillation frequency f into a pulse of a rectangular waveform by a pulse converter, wherein the output which is a sine wave from the crystal oscillator is passed through a crystal filter equal to an AT-cut crystal piece in cutting angle, equal to the crystal oscillator in a frequency-temperature characteristic indicating a curve having an inflection point around an ambient temperature, a maximum value of the frequency characteristic occurring at a temperature lower than the ambient temperature, and a minimum value of the frequency characteristic occurring at a temperature higher than the ambient temperature, and equal to the oscillation frequency f in center frequency f0, and is input into the pulse converter, and output as a pulse with the jitter reduced.

2. The synchronous signal generator according to claim 1, wherein said filter is a crystal filter equal to the crystal oscillator in frequency-temperature characteristic.

3. The synchronous signal generator according to claim 2, wherein respective crystal pieces used for the crystal oscillator and the crystal filter have an equal cutting angle.

4. The synchronous signal generator according to claim 1, wherein said oscillation frequency f is equal to a frequency of a fundamental wave component output from the crystal oscillator.

5. The synchronous signal generator according to claim 1, wherein said pulse converter is a complementary output driver IC.

6. A synchronous signal generator, comprising:

a crystal oscillator unit oscillating an output signal having an oscillation frequency f;

a crystal filter unit equal to an AT-cut crystal piece in cutting angle and also equal to the crystal oscillator unit in a frequency-temperature characteristic indicating a curve having an inflection point around an ambient temperature, a maximum value of the frequency characteristic occurring at a temperature lower than the ambient temperature, and a minimum value of the frequency characteristic occurring at a temperature higher than the ambient temperature, the crystal filter unit converting an output signal from the crystal oscillator unit into a signal close to an ideal sine wave having the oscillation frequency f with the jitter reduced, and outputting the converted signal; and a pulse conversion unit outputting a pulse of a rectangular waveform based on output of said filter unit.

7. The synchronous signal generator according to claim 6, wherein said filter unit converts the signal such that a level of specific frequency component in the output signal from said crystal oscillator unit can be relatively higher than levels of other frequency components, and outputs a resultant signal.

8. The synchronous signal generator according to claim 7, wherein said filter unit is a band pass filter having an oscillation frequency of said synchronous signal generator as a center frequency.

9. The synchronous signal generator according to claim 6 wherein said filter unit is equal to said crystal oscillator unit in frequency-temperature characteristic.

10. The synchronous signal generator according to claim 9 wherein said filter unit is formed by a crystal filter equal to said crystal oscillator unit in cutting angle of crystal piece.

11. A synchronous signal generator, comprising:

crystal oscillator means for oscillating an output signal having an oscillation frequency off;

crystal filter means equal to an AT-cut crystal piece in cutting angle and also equal to the crystal oscillator means in a frequency-temperature characteristic indicating a curve having an inflection point around an ambient temperature, a maximum value of the frequency characteristic occurring at a temperature lower than the ambient temperature, and a minimum value of the frequency characteristic occurring at a temperature higher than the ambient temperature, the crystal filter means for converting an output signal from the crystal oscillator means into a signal close to an ideal sine wave having the oscillation frequency f with the jitter reduced, and for outputting the converted signal; and pulse conversion means for outputting a pulse of a rectangular waveform based on output of said filter means.

12. A synchronous signal generating method obtaining a synchronous signal from output of crystal oscillator unit oscillating an output signal having an oscillation frequency f, comprising:

converting an output signal close to an ideal sine wave having the oscillation frequency f with the jitter reduced by passing the output signal through a crystal filter equal to an AT-cut crystal piece in a cutting angle and also equal to the crystal oscillator unit in a frequency-temperature characteristic indicating a curve having an inflection point around an ambient temperature, a maximum value of the frequency characteristic occurring at a temperature lower than the ambient temperature, and a minimum value of the frequency characteristic occurring at a temperature higher than the ambient temperature; and converting the converted signal into a pulse signal of a rectangular waveform.

13. The synchronous signal generator according to claim 1, wherein a circuit of said filter has a center frequency equal to an initial basic frequency of the crystal of said crystal oscillator.

14. A synchronous signal generator converting an output which is a sine wave from a crystal oscillator of an oscillation frequency f into a pulse of a rectangular waveform by a pulse converter, wherein the output which is a sine wave from the crystal oscillator is passed through a crystal filter equal to an AT-cut crystal piece in cutting angle, equal to the oscillation frequency f in center frequency f0, and equal to the crystal oscillator in frequency-temperature characteristic indicating a curve having an inflection point around the ambient temperature, a maximum value of the frequency characteristic occurring at a temperature lower than the ambient temperature, and a minimum value of the frequency characteristic occurring at a temperature higher than the ambient temperature, a filter output being input into the pulse converter, to output a pulse with the jitter reduced.

* * * * *

UNITED STATES PATENT AND TRADEMARK OFFICE
CERTIFICATE OF CORRECTION

PATENT NO. : 7,259,636 B2
APPLICATION NO. : 10/041011
DATED : August 21, 2007
INVENTOR(S) : Takeo Oita It is certified that error appears in the above-identified patent and that said Letters Patent is hereby corrected as shown below:

Title Page, item [56]
Under References Cited, U.S. Patent Documents, insert the following references:
4,741,340     5/1988   Batina et al.   128/903
4,817,430     4/1989   Benes et al.    73/579
5,382,929     1/1995   Inao et al.     333/187
2002/0093387 A1 7/2002 Oita           331/74

Under References Cited, Foreign Patent Documents, please insert the following references:
EP  1223668  7/2002

Under References Cited, Other Publications, please insert the following references:
Dilworth, "The characteristics of a class of pulsed quartz oscillators," IEEE Colloquium on Characterization of Oscillators Design and Measurement, Feb. 3, 1992, pp. 9/1 – 9/7

Horn, "Basic Electronics Theory," 4th Ed., TAB books, 1994, pp 478-487

Gibilisco, "Handbook of Radio and Wireless Technology," McGraw Hill, 1999, pp 195-197

Column 7, line 3, after the word "frequency", delete "off" and replace with --of f--

Signed and Sealed this

Thirteenth Day of May, 2008

JON W. DUDAS
*Director of the United States Patent and Trademark Office*